United States Patent
Benedix et al.

(10) Patent No.: US 6,635,947 B2
(45) Date of Patent: Oct. 21, 2003

(54) MONOLITHICALLY INTEGRABLE INDUCTOR

(75) Inventors: Alexander Benedix, München (DE); Georg Braun, München (DE); Helmut Fischer, Taufkirchen (DE); Bernd Klehn, München (DE); Sebastian Kuhne, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/934,979

(22) Filed: Aug. 21, 2001

(65) Prior Publication Data

US 2002/0041004 A1 Apr. 11, 2002

(30) Foreign Application Priority Data

Aug. 21, 2000 (DE) .......................... 100 40 811

(51) Int. Cl.$^7$ .............................. H01L 29/00
(52) U.S. Cl. .................................... 257/531
(58) Field of Search ............... 257/68, 531; 336/77, 336/79, 82, 83, 84 R, 92, 110, 186, 187, 231, 232, 224, 12, 170, 173

(56) References Cited

U.S. PATENT DOCUMENTS

| | | | |
|---|---|---|---|
| 4,322,698 A | * | 3/1982 | Takahashi ............. 333/184 |
| 5,610,433 A | | 3/1997 | Merrill et al. |
| 6,326,314 B1 | * | 12/2001 | Merrill ............. 438/750 |

FOREIGN PATENT DOCUMENTS

| | | | |
|---|---|---|---|
| EP | 0 782 190 A2 | | 7/1997 |
| JP | 06204427 A | * | 7/1994 |
| JP | 09-162354 | | 6/1997 |
| JP | 10163422 A | | 6/1998 |
| JP | 11097256 A | | 4/1999 |

* cited by examiner

Primary Examiner—Long Pham
Assistant Examiner—Dana Farahani
(74) Attorney, Agent, or Firm—Laurence A. Greenberg; Werner H. Stemer; Ralph E. Locher

(57) ABSTRACT

A monolithically integrable inductor containing a layer sequence of conductive layers and insulating layers that are stacked mutually alternately above one another is described. The conductive layers are configured in such a way that they form a coil-type structure around a central region, in which giant magnetic resistance materials can be provided.

9 Claims, 2 Drawing Sheets

"Ein"

"Aus"

MONOLITHICALLY INTEGRABLE INDUCTOR

BACKGROUND OF THE INVENTION

FIELD OF THE INVENTION

The present invention relates to a monolithically integrable inductor, which can be used, in particular, in a magnetoresistive random access memory (MRAM) configuration.

Although inductors are important elements of electrical circuits and are often indispensable in the circuits, a monolithically integrable inductor has still not been developed to date. Rather, for integrated circuits, inductors are formed by discrete components, which are connected to the integrated circuit.

One example of an integrated circuit in which magnetic fields and thus inductances are required consists in a MRAM configuration, which, if appropriate, has selection transistors. Such an MRAM configuration has a memory cell array of memory cells, which are disposed in a matrix-like manner and, for example, each contain a layer stack made of a hard-magnetic layer, a tunneling barrier layer and a soft-magnetic layer. The layer stacks are provided at crossover points between word lines and bit lines running perpendicularly to, and at a distance from, the word lines. The currents flowing in the word lines and bit lines generate magnetic fields which can change the magnetization direction of the soft-magnetic layer of the respectively selected memory cell in such a way that this is parallel or antiparallel to the magnetization direction of the hard-magnetic layer. A parallel magnetization of the soft-magnetic layer with respect to the hard-magnetic layer yields a lower resistance of the layer stack than an antiparallel magnetization of these layers. The different resistances of the layer stack can then be interpreted as an information unit of "0" or "1".

On account of the progressive miniaturization of integrated circuits, the word line and the bit line of a selected memory cell, which generate the magnetic field that defines the magnetization direction of the soft-magnetic layer, are current-carrying lines having minimal dimensions which can thus only be utilized for currents in the mA range, which yield a correspondingly weak magnetic field, with the result that reliable determination of the magnetization direction in the soft-magnetic layer poses problems. In other words, the generation of local stronger magnetic fields by an integrable coil would be highly beneficial here, especially as the strength of the magnetic field could be brought to the desired level by way of the number of turns of the coil.

SUMMARY OF THE INVENTION

It is accordingly an object of the invention to provide a monolithically integrable inductor which overcomes the above-mentioned disadvantages of the prior art devices of this general type, which, in particular, can advantageously be used in an MRAM configuration.

With the foregoing and other objects in view there is provided, in accordance with the invention, a monolithically integrated inductor. The inductor contains a layer sequence formed of a plurality of mutually respectively alternating conductive layers and insulating layers disposed such that the conductive layers and the insulating layers are stacked above one another. The insulating layers are formed in a whole-area manner and the conductive layers have central regions and edge regions contiguous with the central regions. The edge regions in successive ones of the conductive layers are offset relative to one another. Additional insulating layers are provided. One of the additional insulating layers is disposed in one of the central regions and the edge regions of each of the conductive layers. Contacts connect the conductive layers to one another through the insulating layers, the contacts between successive ones of the conductive layers are disposed in each case in the insulating layers in regions close to the edge regions. Giant magnetic resistance (GMR) materials are used. The layer sequence has a central region with a trench formed therein filled with the giant magnetic resistance materials forming a magnetoresistive random access memory (MRAM) cell. The central region of the layer sequence is defined by the central regions of the conductive layers.

The present invention thus provides a monolithically integrable inductor containing a plurality of mutually respectively alternating conductive and insulating layers and contacts that connect the conductive layers to one another through the insulating layers. In which the conductive and the insulating layers are stacked above one another and the insulating layers are formed in a whole-area manner, in which, moreover, in each conductive layer, the central region and an edge region contiguous with the latter are replaced by an additional insulating layer. In which, moreover, the edge regions in successive conductive layers are offset relative to one another, and in which, finally, the contacts between successive layers are in each case located between the layers in regions close to the edge regions.

The monolithically integrable inductor according to the invention thus forms, with a layer sequence containing the conductive and insulating layers, a coil whose area occupancy is given by "9F", where F defines the minimum feature size. Such a layer sequence can readily be realized for example using customary CMOS technology, by stacking insulating layers made of e.g. silicon dioxide and conductive layers made of e.g. polycrystalline silicon above one another, e.g. aluminum being used for the contacts.

An MRAM cell can be formed by providing a trench in the central region, a layer stack made of a hard-magnetic layer, a tunneling barrier layer and a soft-magnetic layer being introduced into the trench. The layer stack is electrically isolated from the layer sequence containing the insulating layers and conductive layers by the remaining edge of the additional insulating layer forming the central region and is surrounded by the layer sequence, which forms a coil, with the result that a sufficiently strong magnetic field prevails in the layer stack when a corresponding signal having a current intensity in the mA range is applied to the coil containing the layer sequence.

A particularly effective coil is obtained if the edge regions in the successive conductive layers are offset with respect to one another in such a way that the conductive layers connected to one another via the contacts form a coil-type structure. In this case, the edge regions may be offset relative to one another by a regular angle in or counter to the clockwise direction. The angle may be about 90° if a total of four conductive layers are provided which are isolated from one another by three intervening insulating layers.

The layer stack in the trench is also designated as a giant magnetic resistance (GMR). The vertical configuration of the GMR in the trench allows the use of cells, which are a few $\mu$m long and, at the same time, have a minimal area requirement.

The trench can readily be introduced into the central region of the layer sequence, for example by deep etching ("deep trench etching"), in which e.g. the silicon dioxide of the additional insulating layers in the central region and of the insulating layers isolating these is removed.

The conductive layers are formed form polycrystalline silicon and the polycrystalline silicon can be doped. The layer sequence as a whole is formed on a semiconductor body.

Other features which are considered as characteristic for the invention are set forth in the appended claims.

Although the invention is illustrated and described herein as embodied in a monolithically integrable inductor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
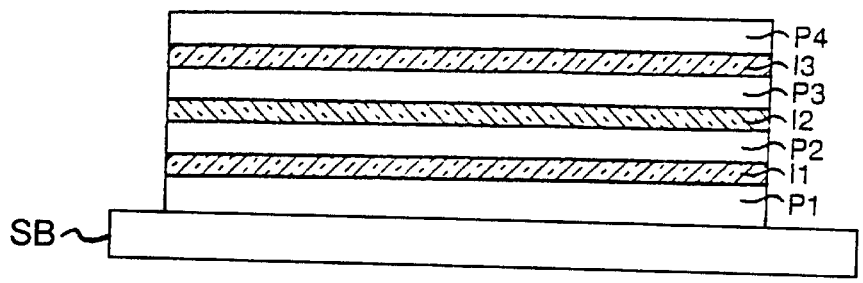
FIG. 1 is a diagrammatic, cross-sectional view of a layer sequence containing conductive and insulating layers.

In all the figures of the drawing, sub-features and integral parts that correspond to one another bear the same reference symbol in each case. Referring now to the figures of the drawing in detail and first, particularly, to FIG. 1 thereof, there is shown a layer sequence containing conductive layers P1, P2, P3 and P4 and insulating layers I1, I2 and I3 which are each situated between the conductive layers P1–P4, with the result that, by way of example, the insulating layer I1 is located between the conductive layers P1 and P2, the insulating layer I2 is located between the conductive layers P2 and P3, and the insulating layer I3 is located between the conductive layers P3 and P4. By way of example, silicon dioxide can be used for the insulating layers I1–I3, while a suitable material for the conductive layers P1–P4 is polycrystalline silicon, which may be doped. It goes without saying that other materials may also be chosen, such as, for example, aluminum for the conductive layers P1–P4 and silicon nitride for the insulating layers I1–I3. The layer sequence is disposed on a semiconductor body SB.

Figures 2A, 2B, 2C, 2D:
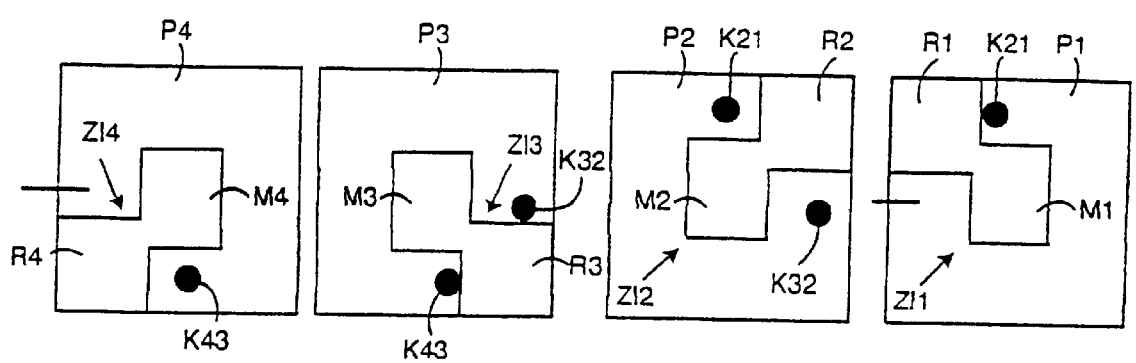
FIGS. 2a to 2g are longitudinal sectional views showing individual conductive layers (FIGS. 2a to 2d) and insulating layers (FIGS. 2e to 2g) of the layer sequence, the insulating layers in each case being shown hatched in order to clarify the illustrations.
Figures 2E, 2F, 2G:
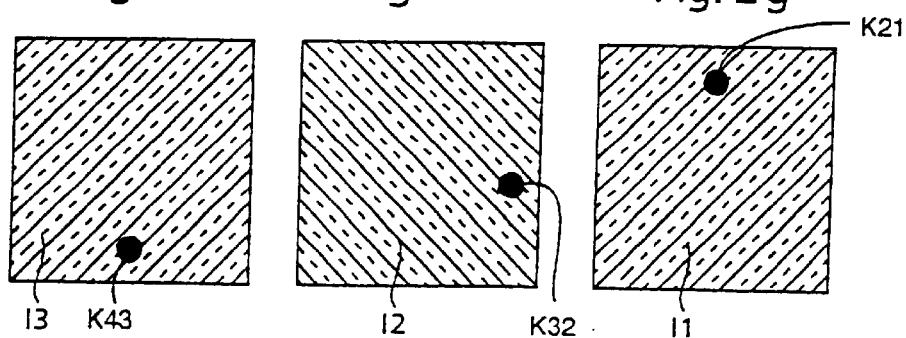

FIGS. 2a to 2g each show in sectional views the conductive layers P4 (FIG. 2a), P3 (FIG. 2b), P2 (FIG. 2c) and P1 (FIG. 2d) and also the insulating layers I3 (FIG. 2e), I2 (FIG. 2f) and I1 (FIG. 2g). The conductive layers contain additional insulating layers ZI4 for the conductive layer P4, ZI3 for the conductive layer P3, ZI2 for the conductive layer P2 and ZI1 for the conductive layer P1. The additional insulating layers ZI1, ZI2, ZI3 and ZI4 each contain a central part M1 to M4 and an edge part R1 to R4. It should be noted that the additional insulating layers ZI1 to ZI4 are not indicated in FIG. 1 in order to simplify the illustration. The same also applies to contacts K43, K32 and K21, which respectively connect the conductive layers P4 and P3, the conductive layers P3 and P2 and the conductive layers P2 and P1 to one another via corresponding holes in the insulating layers I3 and I2 and I1, respectively.

As can be seen from FIGS. 2a to 2d, the central parts M1 to M4 of the additional insulating layers ZI1 to ZI4 in the layer sequence is in each case situated at the same location, with the result that, in the central region of the layer sequence, there is a continuous insulating region via the intervening insulating layers I1 to I3. By contrast, the edge regions R1 to R4 of the individual additional insulating layers ZI1 to ZI4 are disposed cyclically offset with respect to one another in such a way that overall, in the layer sequence, a coil-type structure is formed by the conductive layers P1 to P4. In other words, the edge regions R1 to R4 are disposed offset with respect to one another, adjacent edge regions being located at an angle of in this case 90° with respect to one another with regard to the central regions M1 to M4. The angle is preferably 360°/n, where n denotes the number of conductive layers and thus the "turns" of the coil.

The inductor explained with reference to FIGS. 1 and 2a to 2g thus contain a total of four conductive layers P1 to P4 and three intervening insulating layers I1 to I3 and also the additional insulating layers ZI1 to ZI4. It goes without saying that it is also possible to provide more or fewer conductive layers, insulating layers and corresponding additional insulating layers. What is essential, however, is that the conductive layers P1 to P4 overall form a coil-type structure via the contacts K21, K32 and K43 that connect them, the structure constituting a coil which generates a relatively strong magnetic field in the central region.

The conductive layers P1 to P4 and the insulating layers I1 to I3 can readily be formed by vapor deposition, for example. The same also applies to the additional insulating layers ZI1 to ZI4, which can be patterned by etching. Etching can also be performed to provide the conductive layers P1 to P4 with the shape that forms the coil. However, it goes without saying that other technologies are also possible and can be employed for producing the layers of the layer sequence.

Figure 3A:
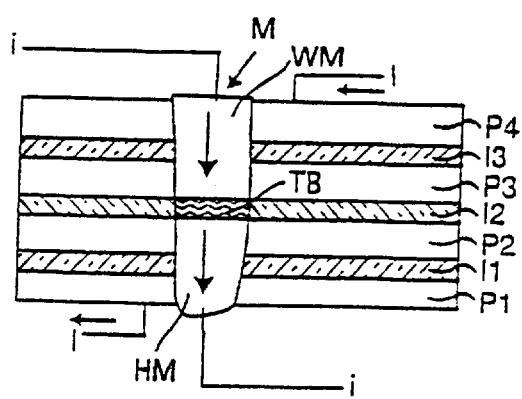
FIGS. 3a and 3b are cross-sectional views of the layer sequence with an additional GMR layer stack in two magnetization states, namely a parallel magnetization (FIG. 3a) and an antiparallel magnetization (FIG. 3b)
Figure 3B:
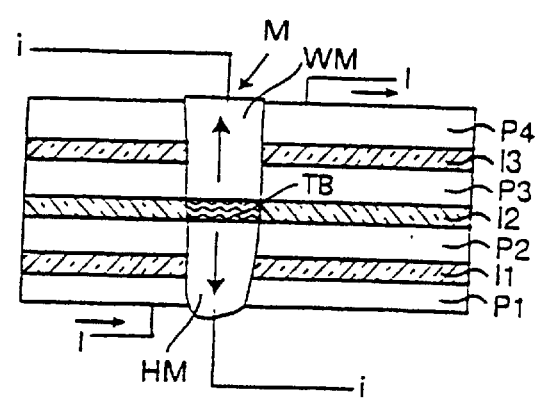

FIGS. 3a and 3b show the layer sequence of FIG. 1, in this case a layer stack made of a hard-magnetic layer HM, a tunneling barrier layer TB and a soft-magnetic layer WM being located in a central region M. For this purpose, the central regions M1 to M4 of the additional insulating layers ZI1 to ZI4 and of the intervening insulating layers I1 to I3 are removed by etching, for example, in such a way that an insulating edge remains, which electrically insulates the soft-magnetic layer WM, the tunneling barrier layer TB and the hard-magnetic layer HM from the conductive layers P1 to P4.

A current I flows through the conductive layers P1 to P4, which current generates a magnetic field in the central region M. The magnetic field sets the magnetization direction of the soft-magnetic layer WM, with the result that, depending on the current direction of the current I, the magnetization direction is parallel to the magnetization direction of the hard-magnetic layer HM, as is shown in FIG. 3a, or is antiparallel thereto, as revealed by FIG. 3b. The parallel magnetization of the layers WM and HM is assigned a low electrical resistance of the layer stack containing the layers WM, TB and HM, while the antiparallel magnetization leads to a higher resistance of the layer stack. The resistance can be measured by a current i flowing through the layer stack, and evaluated.

Figure 4A:
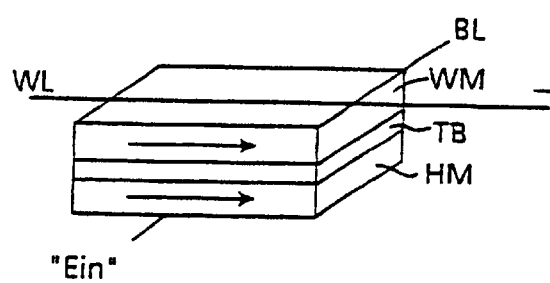
FIGS. 4a and 4b are perspective views of GMR layer stacks for clarifying two logic states, namely "ON" (FIG. 4a) and "OFF" (FIG. 4b).
Figure 4B:
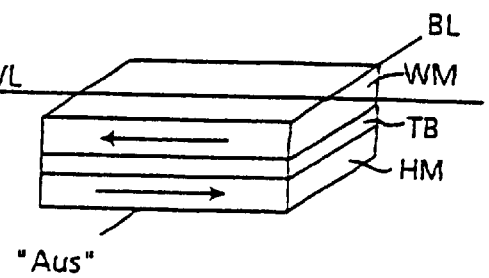

FIGS. 4a and 4b again illustrate the layer stack made of the hard-magnetic layer HM, the tunneling barrier layer TB and the soft-magnetic layer WM, although the layer stack is located here in an existing MRAM configuration between a word line WL and a bit line BL and is written to and read from via the latter.

If the layer sequence of FIGS. 3a and 3b is used in an existing MRAM configuration, then the current I, for example, is written to the cell via the word line WL and the bit line BL, while the read current i is conducted away via an additional line which may be parallel to the word line WL or parallel to the bit line BL.

An essential advantage of the monolithically integrable inductor according to the invention also resides in the fact that the layer sequence containing the conductive layers P1 to P4 and the insulating layers I1 to I3 can be readily provided on a semiconductor body. It is then possible to embed transistors into the semiconductor body for the individual memory cells, with the result that the individual memory cells can each be provided with a switching transistor.

We claim:

1. A monolithically integrated inductor, comprising:
   a layer sequence formed of a plurality of mutually respectively alternating conductive layers and insulating layers disposed such that said conductive layers and said insulating layers are stacked above one another, said insulating layers formed in a whole-area manner, said conductive layers having central regions and edge regions contiguous with said central regions, in which said edge regions in successive ones of said conductive layers are offset relative to one another;
   additional insulating layers, one of said additional insulating layers disposed in one of said central regions and said edge regions of each of said conductive layers, said additional insulating layers replacing said conductive layers in said central regions and said edge regions;
   contacts connecting said conductive layers to one another via holes through said insulating layers, said contacts between successive ones of said conductive layers disposed in each case in said insulating layers in regions close to said edge regions; and
   giant magnetic resistance materials, said layer sequence having a central region with a trench formed therein filled with said giant magnetic resistance materials forming a magnetoresistive random access memory cell, said central region of said layer sequence defined by said central regions of said conductive layers.

2. The monolithically integrated inductor according to claim 1, wherein said GMR materials include a layer stack made of a hard-magnetic layer, a tunneling barrier layer and a soft-magnetic layer.

3. The monolithically integrated inductor according to claim 1, wherein said edge regions in successive ones of said conductive layers are offset with respect to one another such that said conductive layers are connected to one another via said contacts and form a coil-type structure.

4. The monolithically integrated inductor according to claim 1, wherein said edge regions are offset relative to one another by a regular angle in or counter to a clockwise direction.

5. The monolithically integrated inductor according to claim 4, wherein said regular angle is 90°.

6. The monolithically integrated inductor according to claim 1, wherein said conductive layers are formed from polycrystalline silicon.

7. The monolithically integrated inductor according to claim 6, wherein said polycrystalline silicon is doped.

8. The monolithically integrated inductor according to claim 1, including a semiconductor body upon which said layer sequence of said conductive layers and said insulating layers is disposed.

9. A monolithically integrated inductor, comprising:
   a layer sequence formed of a plurality of mutually respectively alternating layers including given layers and insulating layers, said alternating layers disposed to stack said given layers and said insulating layers above one another, said insulating layers formed in a whole-area manner, each of said given layers having a conductive region, a central region and an edge region contiguous with said central region, edge regions in successive ones of said given layers being offset relative to one another, central regions and said edge regions in said given layers forming additional insulating layers;
   contacts connecting said given layers to one another via holes through said insulating layers, said contacts between successive ones of said given layers disposed in each case in said insulating layers in regions close to said edge regions; and
   giant magnetic resistance materials, said layer sequence having a central region with a trench formed therein filled with said giant magnetic resistance materials forming a magnetoresistive random access memory cell, said central region of said layer sequence defined by said central regions of said given layers.

* * * * *